(12) United States Patent  
Mori

(10) Patent No.: US 6,456,360 B1
(45) Date of Patent: Sep. 24, 2002

(54) PROJECTION EXPOSURE APPARATUS AND METHOD

(75) Inventor: Susumu Mori, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/243,688

(22) Filed: Feb. 3, 1999

Related U.S. Application Data

(63) Continuation of application No. 08/325,619, filed on Oct. 19, 1994, now abandoned.

(30) Foreign Application Priority Data

Oct. 20, 1993 (JP) .............................................. 5-262289

(51) Int. Cl.$^7$ ......................... G03B 27/42; G03B 27/48; G03B 27/52
(52) U.S. Cl. .............................. 355/53; 355/50; 355/55
(58) Field of Search ............................... 355/50, 53, 55, 355/51, 77, 67, 68, 69, 54

(56) References Cited

U.S. PATENT DOCUMENTS

| 4,924,257 A | * | 5/1990 | Jain | 355/53 |
| 5,150,152 A | * | 9/1992 | Isohata et al. | 355/53 |
| 5,168,306 A | * | 12/1992 | Morimoto et al. | 355/53 |
| 5,194,893 A | * | 3/1993 | Nishi | 355/53 |
| 5,227,839 A | * | 7/1993 | Allen | 355/53 |
| 5,255,051 A | * | 10/1993 | Allen | 355/77 |
| 5,285,236 A | * | 2/1994 | Jain | 355/53 |
| 5,291,240 A | * | 3/1994 | Jain | 355/53 |
| 5,298,939 A | * | 3/1994 | Swanson et al. | 355/53 |
| 5,477,304 A | * | 12/1995 | Nishi | 355/53 |
| 5,483,311 A | * | 1/1996 | Sakakibara et al. | 355/53 |
| 5,602,619 A | * | 2/1997 | Sogard | 355/53 |
| 5,796,469 A | * | 8/1998 | Ebinuma | 355/53 |
| 5,854,671 A | * | 12/1998 | Nishi | 355/53 |
| 5,978,071 A | * | 11/1999 | Miyajima et al. | 355/53 |
| 6,268,906 B1 | * | 7/2001 | Suzuki | 355/67 |

FOREIGN PATENT DOCUMENTS

JP          62-122126          6/1987

* cited by examiner

Primary Examiner—Russell Adams
Assistant Examiner—Rodney Fuller
(74) Attorney, Agent, or Firm—Miles & Stockbridge P.C.

(57) ABSTRACT

A projection exposure apparatus has a magnifying projection optical system for projecting a magnified image of an original on a photosensitive substrate, a first position detecting element for detecting a position of the original, a second position detecting element for detecting a position of the photosensitive substrate, and a drive device for moving the original and the photosensitive substrate in a predetermined relationship relative to the magnifying projection optical system. The drive device performs the movements on the basis of results of the first and second position detecting elements.

33 Claims, 3 Drawing Sheets

PROJECTION EXPOSURE APPARATUS AND METHOD

CROSS-REFERENCE TO RELATED APPLICATION

This application is a continuation of application Ser. No. 08/325,619 filed Oct. 19, 1994 (abandoned).

BACKGROUND OF THE INVENTION

1. Field of the Invention

The present invention relates generally to an exposure apparatus and method and, more particularly, to an exposure apparatus for a large-sized substrate such as a liquid crystal display panel.

2. Related Background Art

Display quality of the liquid crystal display panel has been remarkably improved in recent years. Use of liquid crystal display panels has been widespread because of its advantages of being small both in thickness and weight, in place of the CRT. There have been advancements in colorization and scale-up of a direct-view type liquid crystal panel especially by an active matrix method, and glass substrates employed for manufacturing this panel have increased in size.

Exposure methods for exposing such a large-sized substrate (photosensitive substrate) include a so-called proximity method, a step-and-repeat method and a mirror projection method. The proximity method involves batch-illumination of a mask and a photosensitive substrate that are in close proximity to each other. In the step-and-repeat method, a projection optical system is constructed as an equi-powered lens image forming system providing a large transfer area.

In the mirror projection method, the projection optical system is constructed as an equi-powered mirror image forming system, and a scan exposure is performed by projecting a mask image in a circular arc on the photosensitive substrate.

When the exposure based on the proximity method is used for the large-sized substrate, it is required that the large-sized mask and the photosensitive substrate be made as close as several tens of $\mu$ms. Proximity spacing largely influences configuration, line width and resolution of the image to be transferred. It is quite difficult to transfer the mask pattern with no defect onto the entire surface of the photosensitive substrate because problems with flatness of the mask and the photosensitive substrate, protrusions of a resist coated on the photosensitive substrate and dust on the surface make it difficult to achieve close proximity. Thus the proximity method is unsuited to the liquid crystal panel based on the active matrix method. For this reason, the proximity method is employed for the liquid crystal panel oriented exposure apparatus according to a TN (Twisted Nematic) method and an STN (Super-Twisted Nematic) method.

The step-and-repeat method involves the use of a reticle on the order of 6 inches, which is relatively small as compared with the photosensitive substrate, and a transfer onto the large-sized substrate is effected by the step-and-repeat process. In the step-and-repeat method, a reticle used for semiconductor exposure can be employed as an original, and, therefore, it is possible to apply techniques developed for the semiconductor exposure, such as management of writing accuracy and pattern dimensions and also management of dust. However, when an image is transferred onto a large-sized substrate, in the case of an exposure of a device having a large area that the projection optical system can not cover, a so-called split exposure is required to be conducted, wherein the device is split into small area, and the exposure is performed while joining these areas to each other on the photosensitive substrate.

In this split exposure, if a trace of positional deviation and a variation in density are produced at a boundary portion (split portion) of patterns undergoing the split exposures on the display region of the liquid crystal panel based on, especially, the active matrix method, such differences are perceived by sensitive human sight when a device is completed. It may happen that this causes a problem in terms of the display quality. Besides, if the number of split areas increases, the reticle has to be replaced many times when a single photosensitive substrate is exposed, and it follows that processing capability is decreased.

In the mirror projection method, the transfer is carried out by an equi-powered system, and, hence, there is needed a large-sized mask corresponding to a size of the photosensitive substrate. Writing of the large-sized mask becomes practicable, however, there are many problems to be obviated. Since the exposure is effected by scanning a circular-arc slit on the photosensitive substrate, it is therefore required that slit length be elongated according to the scale-ups of the photosensitive substrate and the liquid crystal panel. Consequently, the mirror-based equi-powered image forming system has to be increased in size, resulting in a scale-up of the optical system. This causes a remarkable increment in the cost of the apparatus.

SUMMARY OF THE INVENTION

It is an object of the present invention to provide an exposure apparatus and method capable of performing an exposure on a large-sized substrate without splitting a device into small areas, wherein an original involves the use of, e.g., a reticle.

To accomplish the above object, according to the present invention, not a large-sized mask but a reticle on the order of 6 inches is employed as an original, and a projection optical system involves the use of a magnifying image forming system set to a magnification determined by a size of whole patterns (pattern area) of the reticle and a size of an exposed area on a photosensitive substrate so that the whole patterns of the reticle correspond to the exposed area on the photosensitive substrate. Further, an area of reticle patterns transferred onto the photosensitive substrate by the magnifying image forming system is enlarged, and, at the same time, the entire surface of the photosensitive substrate is exposed without exposing the whole patterns of the reticle on the photosensitive substrate at one time, because of a relationship with an image circle (effective projection area) of the projection optical system. The invention employs a scan exposure method in which whole patterns of the reticle are partially sequentially exposed on the photosensitive substrate. For this reason, there arises a necessity for performing a scan in which the reticle and the photosensitive substrate are related in a predetermined relationship with respect to the magnifying projection optical system. A position detecting device for detecting a position of the reticle and a position detecting device for detecting a position of the photosensitive substrate are provided. At the same time, items of positional data of the reticle and the photosensitive substrate are obtained from these position detecting devices. A drive device is provided for moving the reticle and the photosensitive substrate while keeping the above predetermined relationship. The drive device moves the reticle and the photosensitive substrate on the basis of the positional data thereof inclusively of data about aberrations, etc. of the projection optical system.

Further, a preferable range is as follows:

$$1.5 \leq \beta \leq 4.0$$

where β is the magnification of the projection optical system. If under a lower limit, an exposure area with respect to the photosensitive substrate becomes too small, and consequently a necessity for splitting arises. Also, if above an upper limit, no matter how high the accuracy with which patterns of the reticle original can be created may be, the magnification is too large. It is therefore difficult to keep the accuracy of the pattern to be transferred onto the photosensitive substrate due to the aberrations of the projection optical system.

According to the present invention, the reticle patterns are sequentially exposed in an area defined by an image circle of the projection optical system on an exposed surface of the photosensitive substrate. With an illumination system and the projection optical system fixed to the exposure apparatus, the drive device moves the reticle and the photosensitive substrate on the basis of the positional data of the reticle and the photosensitive substrate so that a projection area on the reticle pattern is exposed exactly on a corresponding projected area on the exposed surface of the photosensitive substrate. As described above, according to the present invention, a reticle is employed as the original, and it is therefore possible to use techniques established by semiconductor exposure with respect to the management of the writing accuracy and pattern dimensions and also the management of the dust. Consequently, a high exposure accuracy is exhibited.

Further, the projection optical system is constructed as a magnifying image forming system, and the reticle and the photosensitive substrate are scanned with respect to the projection optical system. Exposure on a large photosensitive substrate can be thereby performed with even a small original without making the image circle of the projection optical system larger than needed. Simultaneously, the scale-up of the projection optical system can be avoided.

That is, a small-sized reticle on the order of 6"–7" can be employed as a mask for the exposure. Further, a non-split exposure can be performed on a large-sized substrate by scanning, wherein the projection optical system is formed as a magnifying system. Moreover, the effective projection area of the magnifying projection optical system may be relatively small as compared with a size of the substrate, hence, avoiding increase in size of the projection optical system.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Figure 1:
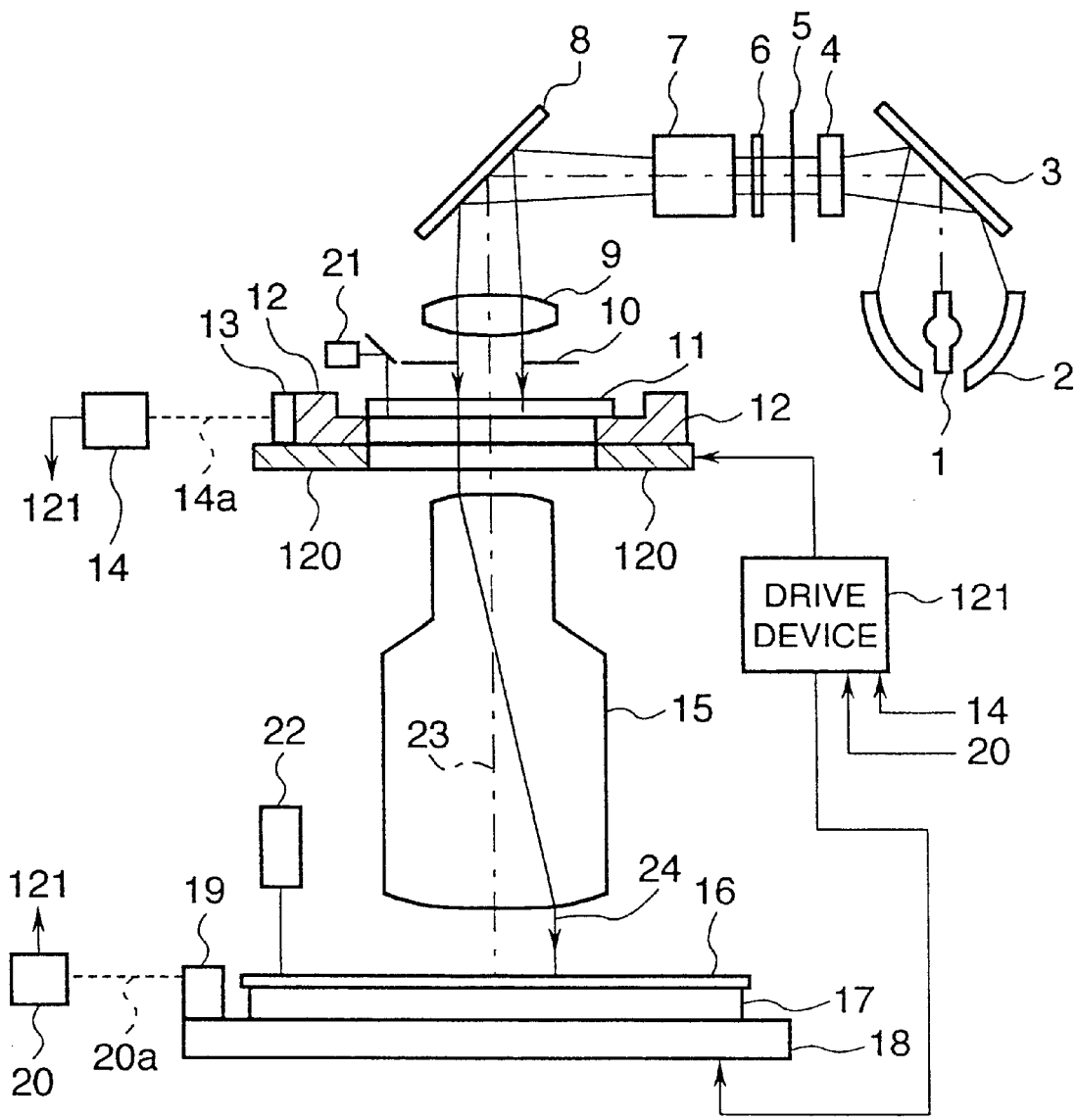
FIG. 1 is a diagrammatic vertical sectional view illustrating an embodiment of a projection exposure apparatus according to the present invention.

Referring to FIG. 1, beams of light emitted from a super-high mercury lamp 1 are converged by an elliptical mirror 2. A reflecting mirror 3 is a dichroic mirror and therefore reflects the light beams used for an exposure of the photosensitive substrate (hereinafter simply termed a substrate) 16 towards a reticle 11 but transmits light beams having a wavelength too long to contribute to the exposure. A lens 4 serves to collimate the converged light beams into parallel light beams. A filter 6 selects an exposure wavelength corresponding to an image forming capability of a projection optical system and, in general, transmits at least one band-width wavelength among i-line (365 mm), h-line (404.6 mm) and g-line (436.0 mm). The exposure light beams to the projection optical system are ON/OFF-controlled by a shutter 5. The exposure light beams having passed through the filter 6 are incident on an optical integrator 7 including a fly-eye lens, etc. The reticle 11 is uniformly illuminated with the exposure light beams through a reflecting mirror 8 and a condenser lens 9. An illumination range (illumination area) falls within an effective projection area, on the reticle 11, of the projection optical system but. is restricted by an aperture 10.

In this embodiment, the aperture 10 is disposed between the condenser lens 9 and the reticle 11, and it follows that an edge of the aperture 10 is blurred on the reticle 11. The reticle 11 and the substrate 16 are scanned with respect to the projection optical system. Consequently, an illuminated pattern area on the reticle 11 is sequentially shifted, with the result that an image of an illuminated pattern area is sequentially exposed on the substrate 16 through a projection optical system 15. It may suffice that an integral exposure quantity on the substrate 16 with respect to the scan becomes fixed. The blurred portions, i.e., the peripheral edges of the exposure areas are so exposed as to be overlapped with each other by scanning, and, therefore, this blur is not a problem. However, for preventing a scan range from extending outside the effective exposure area when effecting the scan, or for improving accuracy of the integral exposure quantity, the aperture 10 is formed on a plane conjugate to the pattern surface of the reticle 11. A blur width of the edge of the aperture 10 can be thereby reduced.

The reticle 11 has patterns formed on the lower surface, and this lower surface (pattern surface) is fixed by vacuum to a reticle holder 12. The reticle holder 12 is mounted on a stage 120 moving parallel to the pattern surface (X-Y- and θ-directions) of the reticle 11 to perform the scan. The stage 120 is controlled by a drive device 121 and thus moves the reticle holder 12. This involves the use of, e.g., a laser interferometer 14 receiving a beam 14a from a reflecting mirror 13 fixed to the reticle holder 12 and detecting a coordinate position of the reticle holder 12 with a high accuracy.

Positions of the reticle 11 and the reticle holder 12 are related to each other, whereby the pattern itself of the reticle 11 corresponds to coordinates of the reticle holder 12. Thus, the pattern of the reticle 11 can be controlled based on the coordinate detected by the beam 14a. The reticle 11 fed by an unillustrated reticle loader is fixed by vacuum to the reticle holder 12, and, thereafter, a fiducial pattern on the reticle 11 is viewed by a position detection system 21 for the reticle pattern. Then, the drive device 121 moves the stage 120 mounted with the reticle holder 12 so that this fiducial pattern comes to a desired position with respect to the detection system 21. An unillustrated locating control system reads the coordinates at that point of time, thereby making the pattern of the reticle 11 correspond to the coordinate position (detected value) given by the laser interferometer 14.

The substrate 16 is fixed by vacuum to a substrate holder 17. The substrate holder 17 is mounted on a stage 18 moving in up-and-down (Z) directions as well as in the X-Y- and θ-directions within the image forming plane of the projection optical system 15. Two-dimensional and up-and-down directional positions of the stage 18 are controlled by the drive device 121. A reflecting mirror 19 is fixed onto the stage 18, and, in the same way as the above reticle, for instance, a coordinate position of the substrate holder 17 can be detected by a beam 20a of a laser interferometer 20. Positions of the substrate 16 and the substrate holder 17 are related to each other, thereby making the pattern exposure area of the substrate 16 correspond to coordinates of the substrate holder 17. Thus, the pattern of the substrate 16 can be controlled based on the coordinate position detected by the beam 20a. The substrate 16 fed by an unillustrated substrate loader is fixed by vacuum to the substrate holder 17, and, thereafter, a fiducial pattern on the substrate 17 is viewed by a position detection system 22 existing above the substrate 17. Then, the drive device 121 moves the stage 18 mounted with the substrate holder 17 so that this fiducial pattern comes to a desired position with respect to the detection system 22. An unillustrated locating control system reads the coordinates at that point of time, thereby making the substrate pattern exposure area correspond to the coordinate position (detected value) given by the laser interferometer 20.

By the way, it is desired that the projection optical system be, as illustrated in FIG. 1, substantially telecentric both on the side of the reticle 11 and on the side of the substrate 16. If not telecentric, when the reticle pattern surface position changes in the Z-direction corresponding to a scan position, due to an influence by planarity of the reticle and flexure of the reticle, a variation in magnification of the image on the substrate through the projection optical system occurs. Particularly, if the projection optical system 15 is a magnifying system, that variation is remarkable. If the substrate surface position changes in the Z-direction corresponding to the scan position due to an influence of planarity of the substrate, the Z-directional position, along an optical axis 23 of the projection optical system 15 is detected by an unillustrated autofocus detection system. Control is conducted to locate the substrate 16 in a predetermined position by the stage 18 moving in the Z-direction, i.e., to align the image forming position of the projection optical system 15 onto the substrate surface. However, in a position of the surface of the substrate 16 off the optical axis 23, for example, in a position through which an optical path 24 passes in FIG. 1, if the projection optical system 15 is not telecentric on the side of the substrate, an X-directional image movement occurs in the Figure, and, as a result, a variation in the image magnification occurs.

Figure 2:
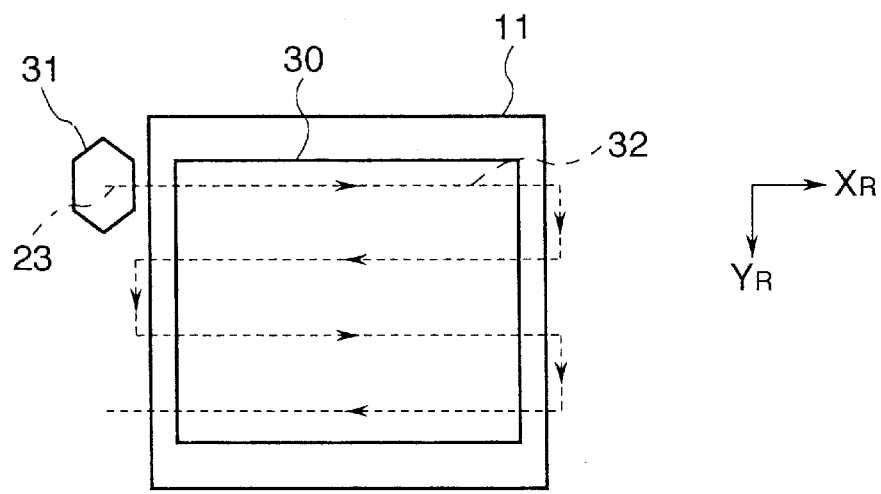
FIG. 2 is a plan view of a reticle of FIG. 1 showing how a scan based on an illumination area is conducted.

FIG. 2 is a plan view of the reticle 11, wherein a pattern to be transferred is written in a range defined by an effective exposure area 30 within the reticle 11. This effective exposure area 30 corresponds to the entire surface of the substrate 16, shown in a plan view of FIG. 3, or to its exposure range. The aperture 10 explained referring to FIG. 1 takes a hexagonal shape (illumination area) generally designated by the numeral 31 in FIG. 2 on the reticle pattern surface. This is magnified and then transferred, as in the case of the projection area 33 shown in FIG. 3, by the magnifying projection optical system 15 described in FIG. 1. On the occasion of an actual exposure, the exposure is effected by a scan (relative movements of the illumination area 31 and the reticle 11 and of the projection area 33 with respect to the photosensitive substrate 16) in accordance with loci 32, 34 shown by dotted lines in FIGS. 2 and 3. A coordinate system $(X_R, Y_R)$ of the reticle that is taken in FIG. 2 and a coordinate system $(X_P, Y_P)$ that is taken in FIG. 3 are related to each other by the following formula:

$$\begin{bmatrix} X_P \\ Y_P \end{bmatrix} = \beta \begin{bmatrix} X_R \\ Y_R \end{bmatrix} \quad (1)$$

where β is the magnification of the projection optical system. The drive device 121 knows coordinate values of the reticle 11 and the substrate 16 from outputs of the laser interferometers 14, 20 and thus controls the coordinate positions of both of the reticle and the substrate by transmitting control signals to the stages 120, 18 to keep the relationship of the formula (1) during the scan. Note that this is an example of an ideal case, but actually, as a matter of course, control is conducted in consideration of distortion, etc. with respect to the projection optical system 15. For this reason, the movable elements of the present apparatus are the reticle elements (11, 12, 120) and the substrate elements (16, 17, 18). Connected to the body of the exposure apparatus are the illumination system designated by the numerals 1 through 10, the laser interferometer 14, the position detecting system 21 for the reticle patterns, the magnifying projection optical system 15, the laser interferometer 20 and the position detecting system.

Figure 3:
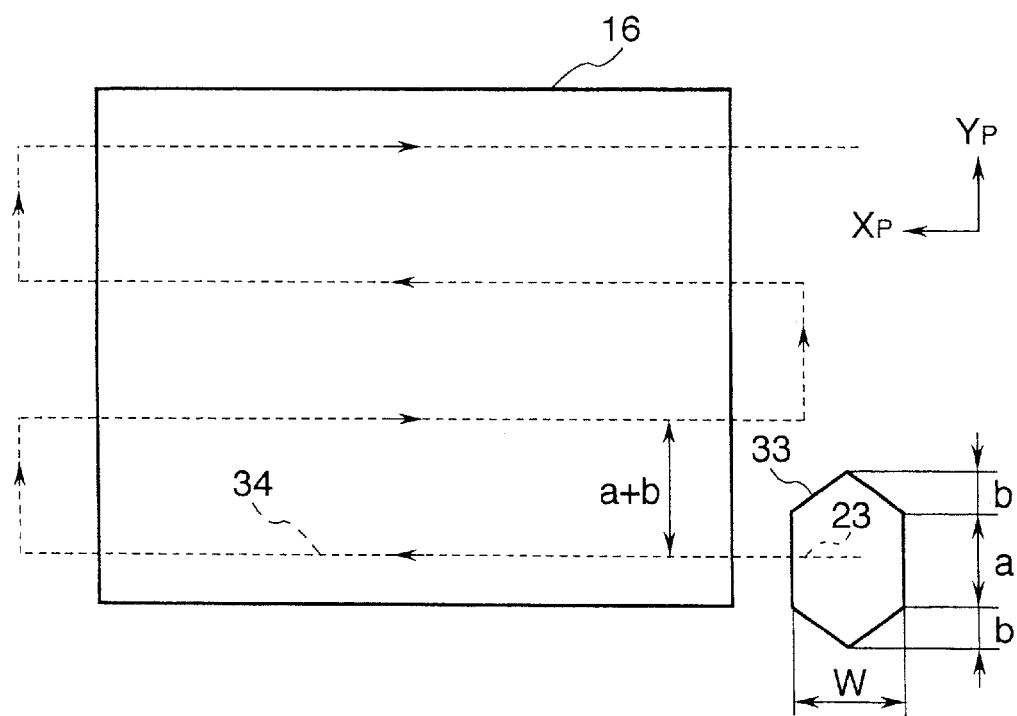
FIG. 3 is a plan view of a photosensitive substrate of FIG. 1 illustrating how a scan based on a reticle pattern image is carried out.
Figure 4:
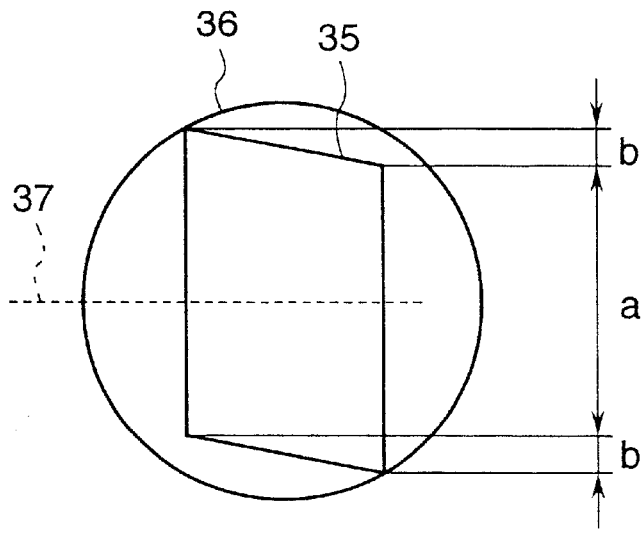
FIG. 4 is a view illustrating another embodiment of a configuration of an aperture.
Figure 5:
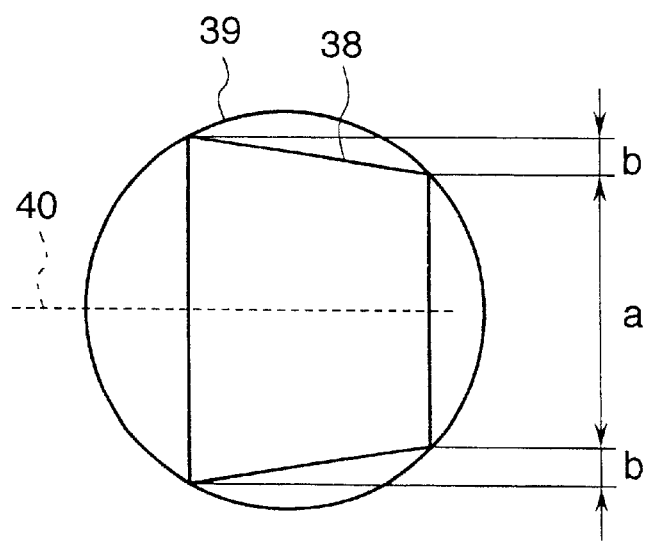
FIG. 5 is a view illustrating still another embodiment of the configuration of the aperture.

In the embodiments discussed so far, the aperture 10 assumes, as illustrated in FIGS. 2 and 3, the hexagonal configuration but this is not necessary. There may suffice configurations satisfying such a condition that a sum of exposure quantities needed for exposures for two scanning processes with respect to portions that are overlap-exposed by scanning, i.e., b-length portions of the projection area 33 in FIG. 3 is equal to an exposure quantity of a non-overlap exposed portion, i.e., an a-length portion of the projection area 33 in FIG. 3. Further, each b-portion is provided as a width for gradually changing a difference between the non-overlap exposed portions adjacent to each other, and hence each b-portion preferably takes such a configuration that an aperture width w in the scan direction is gradually reduced as the aperture extends in the direction orthogonal to the scan direction. Examples shown in FIGS. 4 and 5 can be considered as other aperture configurations satisfying the above condition. The numerals 36, 39 in FIGS. 4 and 5 represent effective projection areas of the projection optical system, and each of these projection areas generally takes a circular shape. Adapted to the present invention are an aperture such as a parallelogram 35 shaped so that its exposed portion is gradually reduced as it extends in the direction orthogonal to a scan direction 37 as illustrated in FIG. 4 and an aperture such as a trapezoid 38 shaped so that the exposed portion is gradually reduced as it extends in the direction orthogonal to a scan direction 40 as shown in FIG. 5.

Table 1 shows examples of a reticle size, an effective illumination area on the reticle, a magnification of the projection optical system and an effective projection area on the substrate. As seen in this Table, in the practical 6"or 7" reticle, a lower limit of the magnification β is 1.5, and, if less than 1.5, it is insufficient a scale-up of the substrate because of the on-the-substrate effective projection area being small. An upper limit of the magnification β is 4.0, and, if more than 4.0, there arise problems in which a positional error of the reticle pattern increases on the substrate, or the substrate becomes too large in size.

Also, when a size of a+2b (see FIG. 3) is presumed as an effective projection area, on the substrate, of the magnifying projection optical system, and when considering an exposure on the assumption that the overlapped portion is 10 mm, and the scan is effected four times in the $X_P$-direction (a proper number of scans is on the order of 4 in view of the throughput), the direction ($Y_P$) orthogonal to the scan direction ($X_P$) is given by 4a+3b. Table 1 also shows a size of a+2b (viz., a $Y_P$-directional length of the effective projection on the substrate) given based on the above.

Note that a $Y_P$-directional step quantity of the transfer pattern 33 per scan is given by a+b.

TABLE 1

| Reticle Size (inch | On-Reticle Effective Illumination Area $X_R \times Y_R$ (mm) | Magnification β | On-Substrate Effective Projection Area $X_P \times Y_P$ (mm) | On-Substrate a + 2b (mm) |
|---|---|---|---|---|
| 6 | 138 × 112 | 2 | 276 × 224 | 68.5 |
| 6 | 138 × 112 | 3 | 414 × 336 | 96.5 |
| 6 | 138 × 112 | 4 | 552 × 448 | 124.5 |
| 7 | 163 × 137 | 1.5 | 244.5 × 205.5 | 43.9 |
| 7 | 163 × 137 | 3 | 489 × 411 | 115.5 |

It is apparent that, in this invention, a wide range of different working modes can be formed based on the invention without deviating from the spirit and scope of the invention. This invention is not restricted by its specific working modes except being limited by the appended claims.

What is claimed is:

1. A projection exposure apparatus for transferring an image of an original onto a photosensitive substrate, comprising:
    a magnifying projection optical system for projecting a magnified image of said original onto said photosensitive substrate, the magnification β of the projection by said magnifying projection optical system satisfying $1.5 \leq \beta \leq 4.0$;
    a first position detecting device having a first interferometer system to detect a position of said original;
    a second position detecting device having a second interferometer system to detect a position of said photosensitive substrate;
    a body which supports at least said magnifying projection optical system and said first interferometer system;
    a moving device which moves said original and said photosensitive substrate relative to said magnifying projection optical system, said moving device moving said original and said photosensitive substrate in a predetermined first direction and in a second direction substantially orthogonal to said first direction; and
    a control device which controls said moving device based on detection results of said first and second position detecting devices.

2. A projection exposure apparatus according to claim 1, wherein said magnifying projection optical system comprises a telecentric optical system.

3. An apparatus according to claim 1, wherein said photosensitive substrate comprises a glass substrate having a square shape.

4. A projection exposure apparatus according to claim 1, wherein said projection exposure apparatus is a projection exposure apparatus for transferring an image of a pattern of a liquid crystal display.

5. A projection exposure apparatus according to claim 1, wherein said control device controls said moving device based on aberration information of said magnifying projection optical system and said detection results.

6. A projection exposure apparatus according to claim 1, wherein said body supports said second interferometer system.

7. An exposure method employing an optical system for magnifyingly exposing an image of an original onto a substrate, comprising the steps of:
    detecting a position of said original and a position of said substrate;
    moving said original and said substrate relative to a predetermined first direction based on results of said detecting and aberration information of said optical system, which performs magnifying exposure; and
    moving said original and said substrate relatively in a second direction substantially orthogonal to said first direction.

8. An exposure method according to claim 7, wherein magnification β of the magnifying exposure of the image of the original onto the substrate satisfies $1.5 \leq \beta \leq 4.0$.

9. An exposure method according to claim 7, wherein said substrate comprises a glass substrate having a square shape.

10. An exposure method according to claim 7, wherein said method is used for exposing an image of a pattern of a liquid crystal display.

11. A projection exposure apparatus for transferring an image of an original onto a photosensitive substrate, comprising:
    a magnifying projection optical system for projecting a magnified image of said original onto said photosensitive substrate, the magnifying projection optical system being telecentric;
    a first position detecting device having a first interferometer system to detect a position of said original;
    a second position detecting device having a second interferometer system to detect a position of said photosensitive substrate;
    a body which supports at least said magnifying projection optical system and said first interferometer system;
    a moving device which moves said original and said photosensitive substrate relative to said magnifying projection optical system, said moving device moving said original and said photosensitive substrate in a predetermined first direction and in a second direction substantially orthogonal to said first direction; and
    a control device which controls said moving device based on detection results of said first and second position detecting devices and information of said magnifying projection optical system.

12. A projection exposure apparatus according to claim 11, wherein said information of said magnifying projection optical system is information related to aberration of said magnifying projection optical system.

13. A projection exposure apparatus according to claim 11, wherein said body supports said second interferometer system.

14. A projection exposure apparatus according to claim 11, wherein said body supports at least one of said second interferometer system and said mask stage.

15. An exposure apparatus for transferring an image of a pattern on a mask onto an object, comprising:

a magnifying projection system disposed between said mask and said object to project said pattern image with a magnification greater than 1;

an aperture member to define a projection area of said pattern image on said object, within which said pattern image is projected by said magnifying projection system;

a mask stage which is movable holding said mask;

an object stage which is movable holding said object;

a first position detecting device having a first interferometer system to detect a position of said mask stage;

a second position detecting device having a second interferometer system to detect a position of said object stage;

a body which supports at least said magnifying projection optical system and said first interferometer system; and a drive device connected to said mask stage and said object stage to move said mask stage and said object stage relatively to said magnifying projection system in accordance with a detection result of said first and second position detection devices in such a way that said projection area of said pattern image on said object sweeps said object in a predetermined sweep pattern wherein a part of an area swept by the pattern image overlaps with another part of the area swept by the pattern image.

16. An exposure apparatus according to claim 15, further comprising:

a first position detection device at least a part of which is connected to said mask stage to detect a position of said mask; and a second position detection device at least a part of which is connected to said object stage to detect a position of said object.

17. An exposure apparatus according to claim 16, wherein said magnifying projection system and said first and second position detection devices are fixed to a body.

18. An exposure apparatus according to claim 15, wherein said aperture member defines said projection area as an area of a trapezoidal or hexagonal shape.

19. An exposure apparatus according to claim 15, wherein said aperture member is disposed at a position conjugate with said pattern on the mask.

20. An exposure apparatus according to claim 15, wherein during an exposure, said object stage is moved over a distance longer than a distance over which said mask stage is moved, by said drive device.

21. An exposure apparatus according to claim 15, wherein said drive device moves said object stage in a plane two-dimensionally.

22. An exposure apparatus according to claim 21, wherein said drive device also moves said object stage in a direction substantially perpendicular to said plane.

23. An exposure apparatus according to claim 15, wherein said drive device moves said mask stage in a plane two-dimensionally.

24. An exposure apparatus according to claim 15, wherein said magnifying projection system projects said pattern image optically.

25. An exposure apparatus according to claim 15, wherein said magnifying projection system is a telecentric optical system.

26. An exposure apparatus according to claim 15, wherein said object is of a rectangular shape.

27. An apparatus according to claim 15, wherein transfer of the pattern image is effected at a plurality of wavelength bands.

28. An apparatus according to claim 27, wherein said plurality of wavelength bands include h-line and g-line.

29. An exposure method employing a projection system for magnifyingly exposing an image of an original onto a substrate, comprising the steps of:

detecting a position of said original by a first interferometer system;

detecting a position of said substrate by a second interferometer system;

supporting at least said projection system and said first interferometer system by a body;

moving said original and said substrate relative to said projection system based on a detection result of said first and second interferometer systems; and exposing said image onto said substrate during the movement of said original and said substrate such that portions of said image overlap each other.

30. An exposure method according to claim 29, wherein magnification $\beta$ of the magnifying exposure of the image of the original onto the substrate satisfies $1.5 \leq \beta \leq 4.0$.

31. An exposure method according to claim 29, further comprising:

supporting said projection system, said first interferometer system and said second interferometer system by a body.

32. An exposure method according to claim 29, wherein said projection system comprises a telecentric optical projection system.

33. An exposure method according to claim 29, wherein said body supports said second interferometer system.

* * * * *